United States Patent [19]

Carson

[11] Patent Number: 5,424,677
[45] Date of Patent: Jun. 13, 1995

[54] COMMON MODE ERROR CORRECTION FOR DIFFERENTIAL AMPLIFIERS

[75] Inventor: Daniel B. Carson, Bothell, Wash.

[73] Assignee: Fluke Corporation, Everett, Wash.

[21] Appl. No.: 269,498

[22] Filed: Jul. 1, 1994

[51] Int. Cl.⁶ ............................................. G01R 19/00
[52] U.S. Cl. ........................................ 330/2; 330/69; 330/258; 324/123 R
[58] Field of Search .............................. 330/2, 69, 258; 324/123 R, 123 C, 124

[56] References Cited

U.S. PATENT DOCUMENTS 3,581,198  5/1971  Shoemaker et al. ................ 330/2 X Primary Examiner—James B. Mullins
Attorney, Agent, or Firm—George T. Noe

[57] ABSTRACT

Common mode error correction for differential amplifiers involves accurately measuring both the input and output of an amplifier using a low-leakage measurement path, and calculating common-mode gain. Two measurements are made at each node by appying two different common-mode voltages. Subtracting one set of measurements from the other eliminates voltage offset errors, and leaves a common-mode error term for gain calculation. The common-mode gain factor is stored, and thereafter, common mode error may be subtracted from measurements made by the differential amplifier.

3 Claims, 2 Drawing Sheets

COMMON MODE ERROR CORRECTION FOR DIFFERENTIAL AMPLIFIERS

BACKGROUND OF THE INVENTION

This invention relates generally to differential amplifiers, and in particular to a method for correcting common mode errors in differential amplifiers.

Differential amplifiers am well known in the art, and have been used for many years to measure the difference between two signals or voltages applied to the two input terminals thereof. A customary specification of differential amplifiers is known as common-mode rejection ratio, which is a measure of the ability of the differential amplifier to block common-mode components of signals or voltages while amplifying the differential signals or voltages.

FIG. 1 shows a typical prior art differential amplifier circuit in which an adjustable component is used to balance the two sides of the amplifier and thereby correct common mode error. An amplifier 10, which may commonly be an integrated circuit, has a pair of inputs, labeled + and − respectively, and an output. The + input is connected to the junction of a pair of resistors 12 and 14 disposed in series between a first input terminal 16 and ground, while the − input is connected to the junction of a pair of resistors 18 and 20 disposed in series between a second input terminal 22 and an output terminal 24, to which the output of the amplifier 10 is also connected. In this configuration, the value resistor 12 is ideally equal to the value of resistor 18, and the value of resistor 14 is ideally equal to the value of resistor 20, thus ideally balancing the two sides of the amplifier. In practice, however, the resistance values are not exactly equal, and therefore one of the resistors, for example, resistor 12, is made variable. The circuit is calibrated by shorting terminals 16 and 22 together and applying a common mode voltage or signal thereto from a calibration source 28 while monitoring the output with a voltmeter 30 connected between output terminal 24 and ground. Resistor 12 is adjusted to provide a reading of zero volts on the voltmeter 30, indicating complete rejection of the common-mode signal or voltage. With the two halves of the amplifier thus balanced, calibration is complete and the differential amplifier may be operated as intended. For extremely high precision differential amplifier action, such as desired for instrumentation amplifiers, it is very difficult to correct for common mode error with balance adjustments unless very expensive linear potentiometers are used. The advent of surface-mounted resistors and laser trimming has permitted some precision to be built in; however, one of the problems of manual calibration or built-in precision is that component values drift with heat and age, and recalibration or replacement becomes necessary.

SUMMARY OF THE INVENTION

In accordance with the present invention, common mode error correction for differential amplifiers involves accurately measuring both the input and output of a differential amplifier using a measuring circuit having low-leakage-current measurement path, and calculating common-mode gain. Two measurements are made at each node by appying two different common-mode voltages. Subtracting one set of measurements from the other eliminates voltage offset errors, and leaves a common-mode error term for gain calculation. The common-mode gain factor is stored, and thereafter, common mode error may be subtracted from measurements made by the differential amplifier.

It is therefore one feature of the present invention to provide a novel common mode error correction method for a differential amplifier.

It is another feature of the present invention to correct common mode error automatically and without the need to make physical calibration adjustments.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
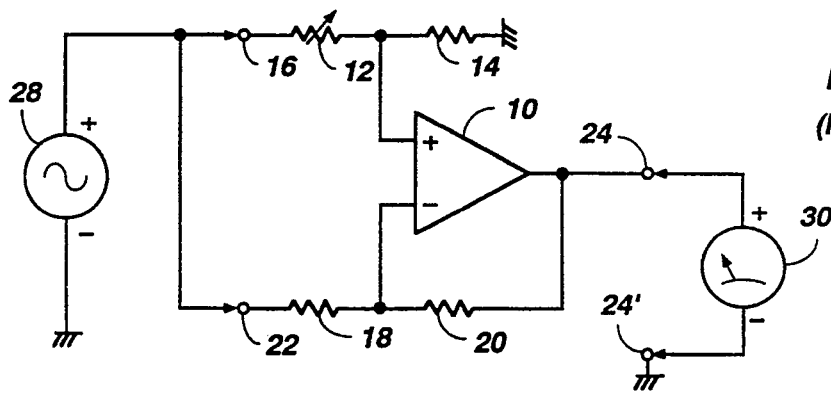
FIG. 1 is a schematic diagram of a typical prior art differential amplifier having a common-mode error adjustment.
Figure 2:
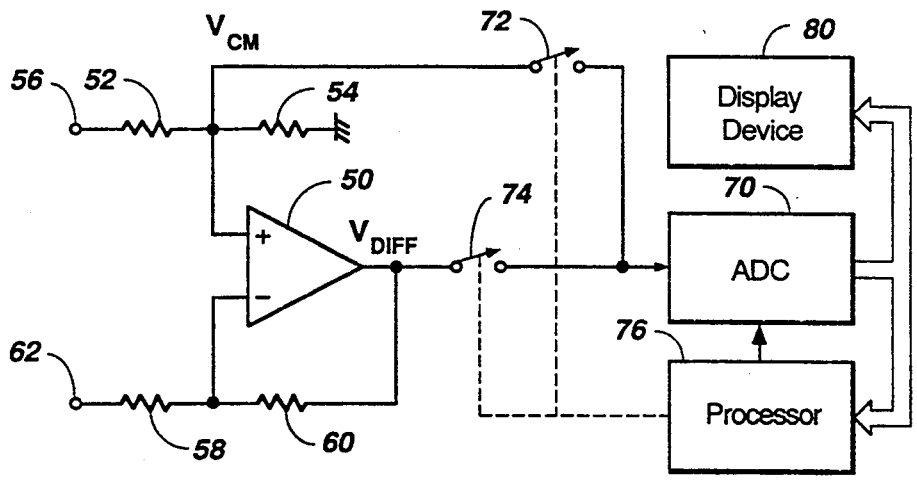
FIG. 2 is a schematic diagram of a differential amplifier having a common-mode error adjustment circuit in accordance with a preferred embodiment of the present invention.

Referring to FIG. 2 of the drawings, there is shown a differential amplifier comprising amplifier 50 with its + input connected to the junction of resistors 52 and 54 serially disposed between a first input terminal 56 and ground on one side, and with its − input connected to the junction of resistors 58 and 60 serially disposed between a second input terminal 62 and the amplifier output on the other side. Resistors 52 and 58 are nominally matched to have substantially equal values and resistors 54 and 60 are also nominally matched to have substantially equal values, and these resistors establish the amplifier gain, as is well known in the art. In a preferred embodiment of the present invention, resistors 52, 54, 58, and 60 are surface mounted on a substrate and laser trimmed to nominal values.

An analog-to-digital converter (ADC) 70, which in the preferred embodiment is a 20-bit ADC for highly accurate measurements, is selectively coupled to the + input of differential amplifer 50 to measure the common-mode input signal or voltage component $V_{CM}$ applied via a switch 72 and coupled to output of the differential amplifier 50 to measure the differential output $V_{DIFF}$ applied via a the switch 74. Switches 72 and 74 are electronic switches, such as CMOS field-effect transistors, and they necessarily exhibit very low leakage, e.g., on the order of several picoamperes maximum, so that the measuring circuits themselves do not introduce any currents which would result in measurement errors. Operation of switches 72 and 74 is controlled in a manner to be described below by a system processor 76, which may suitably be a microprocessor or even a microcomputer. Processor 76 reads the output of ADC 70 when measurements are taken, and calculates the measured value for display on a display device 80.

Figure 3:
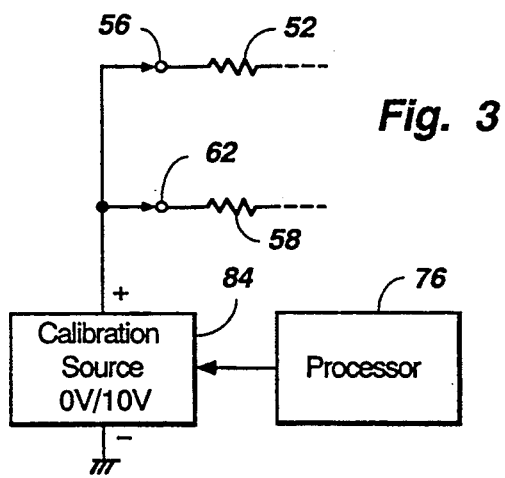
FIG. 3 shows the input circuit of the differential amplifer of FIG. 2 connected for common mode operation.
Figure 4:
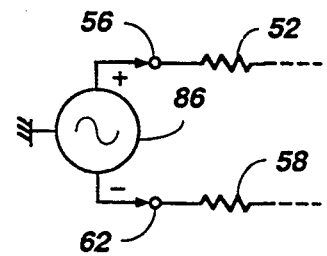
FIG. 4 shows the input circuit of the differential amplifier of FIG. 2 connected for differential mode operation.

FIG. 3 shows the input of the differential amplifer of FIG. 2 configured for common-mode operation and hence determination of common-mode gain N, and FIG. 4 shows the input of the differential amplifier of FIG. 2 configured for differential operation and hence differential gain K. In FIG. 3, a calibration voltage source 84 is connected to input terminals 56 and 62, which are effectively shorted together. Calibration source 84 may suitably be a programmable precision power supply providing precise voltages, such as zero volts and 10.00 volts. Command signals for changing the voltage outputs of calibration source 84 may be provided by processor 76. In FIG. 4, a precision signal generator 86 is connected across input terminals 56 and 62 to provide a known differential signal of precise amplitude. Ground reference for signal generator 86 are shown as being centered to indicate that the differential signal may be one of equal and opposite-polarities applied to the two input terminals.

Figure 5:
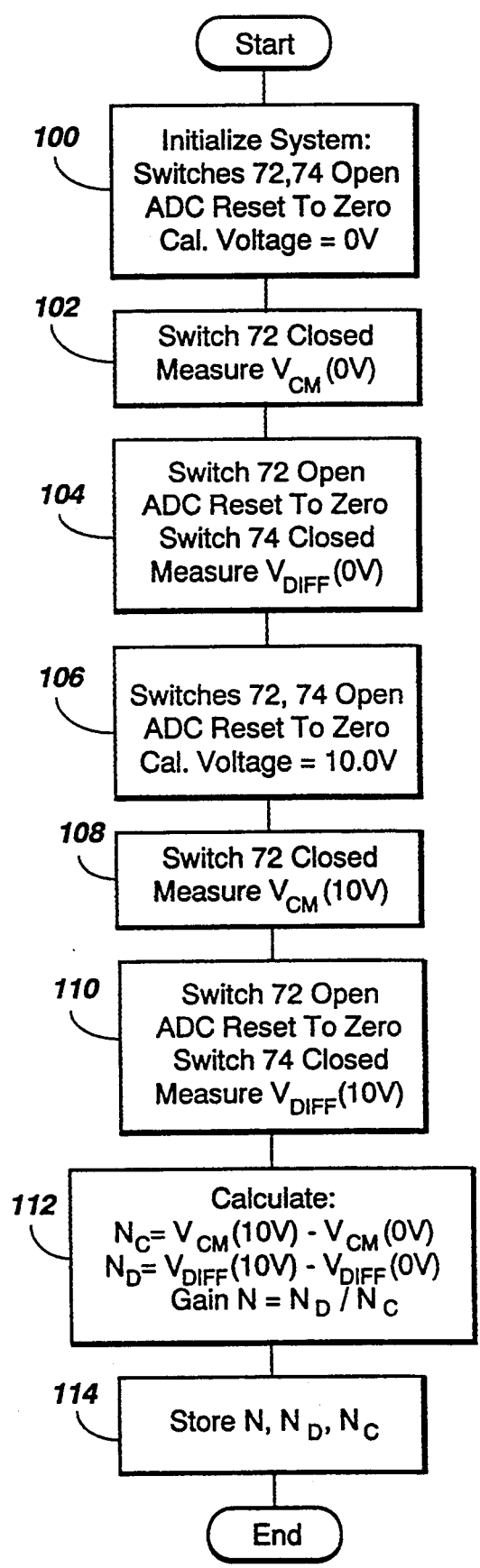
FIG. 5 is a flow chart of a test sequence to determine common-mode gain terms for common-mode error calculation.

Considering first the determination of common mode gain $K_C$ and the attendant errors introduced thereby, refer to the flow diagram of circuit operation as shown in FIG. 5, along with the circuits of FIGS. 2 and 3. In this configuration, input terminals 56 and 62 are effectively shorted together and voltage from calibration source 84 is applied.

In step 100, the system is initialized by opening switches 72 and 74, resetting ADC 70 to provide zero output, and setting the output of calibration source 84 to zero volts.

In step 102, switch 72 is closed, and the voltage $V_{CM}$ at the + input of amplifier 50 is measured by ADC 70 and the reading is stored as $V_{CM(0)}$. This measured voltage should be zero, and any non-zero reading would be due to leakage current injected into resistors 52 and 54 through switch 72. In the present invention, the use of extremely low-leakage switches renders any non-zero reading negligible.

In step 104, switch 72 is opened, ADC 70 is reset to zero, and switch 74 closed. The voltage $V_{DIFF}$ at the output of amplifer 50 is measured by ADC 70 and the reading is stored as $V_{DIFF(0)}$. Again, the measured voltage should be zero, and any non-zero voltage reading would be due to offset errors in amplifier 50, and again, any leakage current injected via switch 74 into resistor 60 would be neglible.

In step 106, switches 72 and 74 are opened, ADC 70 is reset to zero, and the output of calibration source 84 is set to +10.00 volts.

In step 108, switch 72 is closed, and again the voltage $V_{CM}$ at the + input of amplifier 50 is measured by ADC 70, and the reading is stored as $V_{CM(10)}$. This measured voltage should be predominantly the voltage divider ratio of resistors 52 and 54 multiplied by 10.00 volts.

In step 110, switch 72 is opened, ADC 70 is reset to zero, and switch 74 is closed. Again the voltage $V_{DIFF}$ at the output of amplifier 50 is measured by ADC 70 and the reading is stored as $V_{DIFF(10)}$. Again, the measured voltage should be zero, and any non-zero voltage reading would be predominantly common mode error due to mismatch of resistors 52 and 58 or 54 and 60, but would also include offset and leakage current errors.

In step 112, the common-mode output (error) voltage $N_D$ at the output of amplifier 50 is calculated as $N_D = V_{DIFF(10)} - V_{DIFF(0)}$. In making this calculation, the offset voltage term is eliminated. The common-mode input voltage $N_C$ at the + input of amplifier 50 is calculated as $N_C = V_{CM(10)} - V_{CM(0)}$. Common-mode gain N, then, is $N_D/N_C$. All of these terms are stored in step for later use in subtracting common-mode error from measured signals and voltages.

Determination of differential amplifier gain K is made by applying a differential signal to the circuit of FIG. 2 using the precision signal generator 86 of FIG. 4, which provides a known differential signal of precise amplitude across input terminals 56 and 62. The differential signal at the output of amplifier 50 is measured, and differential gain K is simply the differential output voltage $K_D$ divided by the known input signal.

With the determination of common-mode gain, differential gain, elimination of offset voltage, common-mode error in the output of the amplifier system may be subtracted out of the measurements by processor 76. Each time the system is calibrated, the gains are recalculated and new values are stored. By recalibrating, accurate measurements may continue to be made as components, particularly the gain-setting resistors of the differential amplifier, age and values drift.

While I have shown and described the preferred embodiment of my invention, it will be apparent to those skilled in the art that many changes and modifications may be made without departing from my invention in its broader aspects. It is therefore contemplated that the appended claims will cover all such changes and modifications as fall within the true scope of the invention.

What I claim as my invention is:

1. A method for determining and correcting common mode error in a differential amplifier, comprising:
    (a) coupling a measurement circuit to an input node and an output node of said differential amplifier through low-leakage current switches;
    (b) applying a first common mode input voltage to said differential amplifier;
    (c) performing with said measurement circuit a first measurement of voltages at said input node and said output node;
    (d) applying a second common mode input voltage to said differential amplifier;
    (e) performing with said measurement circuit a second measurement of voltages at said input node and said output node; and
    (f) subtracting said first measurement of voltages from said second measurement of voltages to determine common mode gain and error factors.

2. A method in accordance with claim 1 further comprising the step of storing said common mode gain and error factors.

3. A method in accordance with claim 2 further comprising the step of subtracting said common mode gain and error factors from differential voltage measurements made by said differential amplifier.

* * * * *